US008923414B2

United States Patent
Gunawardena et al.

(10) Patent No.: US 8,923,414 B2
(45) Date of Patent: Dec. 30, 2014

(54) SYSTEMS AND METHODS FOR ADAPTIVE SAMPLE QUANTIZATION

(71) Applicants: Sanjeev Gunawardena, Athens, OH (US); Jeff Dickman, Thousand Oaks, CA (US); Mathew A Cosgrove, Woodland Hills, CA (US)

(72) Inventors: Sanjeev Gunawardena, Athens, OH (US); Jeff Dickman, Thousand Oaks, CA (US); Mathew A Cosgrove, Woodland Hills, CA (US)

(73) Assignee: Northrop Grumman Guidance and Electronics Company, Inc., Woodland Hills, CA (US)

( * ) Notice: Subject to any disclaimer, the term of this patent is extended or adjusted under 35 U.S.C. 154(b) by 51 days.

(21) Appl. No.: 13/712,558

(22) Filed: Dec. 12, 2012

(65) Prior Publication Data

US 2013/0148763 A1 Jun. 13, 2013

Related U.S. Application Data

(60) Provisional application No. 61/570,042, filed on Dec. 13, 2011.

(51) Int. Cl.
*H04B 14/06* (2006.01)
*H04B 1/10* (2006.01)

(52) U.S. Cl.
CPC .................................. *H04B 1/10* (2013.01)
USPC ........... 375/245; 375/285; 375/316; 375/346; 341/200

(58) Field of Classification Search
CPC ...... H04B 15/00; H03M 3/422; H03M 3/424; H03M 3/43; H04N 19/0009
USPC ......... 375/245, 254, 285, 316, 340, 346, 348, 375/354, 355, 377; 341/200
See application file for complete search history.

(56) References Cited

U.S. PATENT DOCUMENTS

| 6,600,909 B1 | 7/2003 | Nikulin et al. |
| 6,633,814 B2 | 10/2003 | Kohli et al. |
| 6,765,967 B2 | 7/2004 | Dowling |

(Continued)

FOREIGN PATENT DOCUMENTS

| EP | 0 161 545 B1 | 8/1988 |
| WO | WO 01/77705 A2 | 10/2001 |

(Continued)

OTHER PUBLICATIONS

International Search Report for corresponding PCT/US2012/069248, completed Jan. 14, 2013 by Lee W. Young.

*Primary Examiner* — Jean B Corrielus
(74) *Attorney, Agent, or Firm* — Tarolli, Sunheim, Covell & Tummino LLP

(57) ABSTRACT

One embodiment includes an adaptive sample quantization system. The adaptive sample quantization system includes an antenna to receive a radio frequency (RF) signal having data encoded therein, and analog antenna electronics configured to convert the RF signal to an analog electrical signal. The system also includes an analog-to-digital converter (ADC) directly coupled to the antenna and configured to generate a plurality of consecutive digital samples of the RF signal. The system further includes a quantizer to determine a mode based on the plurality of consecutive digital samples and to select at least one threshold based on the determined mode. The quantizer can further compare each digital sample with the at least one threshold to generate a corresponding one of a plurality of output samples having a reduced number of bits relative to the respective digital sample to substantially mitigate potential interference and facilitate extraction of the data.

20 Claims, 5 Drawing Sheets

(56) References Cited

U.S. PATENT DOCUMENTS

| | | |
|---|---|---|
| 6,816,539 B1 | 11/2004 | Rog |
| 6,842,498 B2 | 1/2005 | Heinzl et al. |
| 6,937,176 B2 | 8/2005 | Freeman et al. |
| 7,173,962 B2 | 2/2007 | Dowling |
| 7,330,140 B2 | 2/2008 | Balakrishnan et al. |
| 7,447,259 B2 | 11/2008 | Betz et al. |
| 7,469,491 B2 * | 12/2008 | McCallister et al. ......... 375/296 |
| 7,729,413 B2 | 6/2010 | Kohli et al. |
| 7,773,698 B2 * | 8/2010 | Niederholz et al. .......... 375/340 |
| 7,852,913 B2 | 12/2010 | Agazzi et al. |
| 7,912,158 B2 * | 3/2011 | Cahn et al. .................... 375/345 |
| 8,018,379 B1 | 9/2011 | Sun et al. |
| 8,488,720 B1 * | 7/2013 | Chavez ......................... 375/322 |
| 2005/0083231 A1 | 4/2005 | Drentea |
| 2007/0069937 A1 | 3/2007 | Balakrishnan et al. |
| 2009/0050685 A1 | 2/2009 | Frederick et al. |
| 2010/0134354 A1 | 6/2010 | Lennen |
| 2010/0176982 A1 | 7/2010 | Lachartre |
| 2011/0117854 A1 | 5/2011 | Ruelke et al. |
| 2011/0181468 A1 | 7/2011 | Sun et al. |
| 2012/0026039 A1 | 2/2012 | Ganeshan et al. |
| 2013/0308728 A1 * | 11/2013 | Lindoff et al. ................ 375/316 |

FOREIGN PATENT DOCUMENTS

| | | |
|---|---|---|
| WO | WO 2004/034604 A1 | 4/2004 |
| WO | WO 2007/092067 A3 | 8/2007 |
| WO | WO 2011/038189 A1 | 3/2011 |
| WO | WO 2011/090498 A1 | 7/2011 |

* cited by examiner

US 8,923,414 B2

SYSTEMS AND METHODS FOR ADAPTIVE SAMPLE QUANTIZATION

RELATED APPLICATIONS

This application claims priority from U.S. Provisional Patent Application Ser. No. 61/570,042, filed 13 Dec. 2011, which is incorporated herein in its entirety.

TECHNICAL FIELD

The present invention relates generally to radio frequency (RF) receiver systems, and specifically to systems and methods for adaptive sample quantization.

BACKGROUND

Certain encoded radio frequency (RF) signals, such as global positioning satellite (GPS) signals, may have weak amplitudes relative to noise and/or other interference, making them more difficult to detect and decode. For example, GPS signals may be approximately 30 dB weaker than power due to thermal noise. Therefore, such signals can be easily jammed by transmission of stronger signals in the same frequency band. Some receivers include automatic gain control (AGC) circuitry that adjusts the gain of the analog front-end stages so that the signal can be optimally sampled by an analog-to-digital converter (ADC). Typical receivers implement ADCs having a relatively low dynamic range (e.g., one to four bit resolution). Thus, when such receivers are subject to interference, the AGC circuitry can reduce the analog dynamic range of the received signal to fit within the relatively low dynamic range of the ADC, thus suppressing the data encoded within. As a result, the encoded data can be lost or severely limited by such operation of the AGC in the presence of interference.

SUMMARY

One embodiment of the invention includes an adaptive sample quantization system. The adaptive sample quantization system includes an antenna configured to receive a radio frequency (RF) signal having data encoded therein, and analog antenna electronics configured to convert the RF signal to an analog electrical signal. The system also includes an analog-to-digital converter (ADC) directly coupled to the antenna and configured to generate a plurality of consecutive digital samples of the RF signal. The system further includes a quantizer configured to determine a mode based on the plurality of consecutive digital samples and to select at least one threshold based on the determined mode. The quantizer can be further configured to compare each digital sample with the at least one threshold to generate a corresponding one of a plurality of output samples having a reduced number of bits relative to the respective digital sample to substantially mitigate potential interference and facilitate extraction of the data.

Another embodiment of the invention includes method for quantizing a radio frequency (RF) input signal. The method includes receiving the RF input signal at an antenna, the RF input signal having data encoded therein and generating a plurality of consecutive digital samples of the RF signal. The method also includes generating a histogram of a set of the plurality of consecutive digital samples of the RF signal over a predetermined period of time. The method also includes selecting at least one threshold based on the histogram and comparing each of the plurality of digital samples with the at least one threshold. The method further includes generating a plurality of output samples based on the comparison of each of the respective plurality of digital samples with the at least one threshold, each of the plurality of output samples having a reduced number of bits relative to each of the respective plurality of digital samples to substantially mitigate potential interference and to facilitate extraction of the data.

Yet another embodiment of the invention includes an adaptive sample quantization system. The adaptive sample quantization system includes an antenna configured to receive a radio frequency (RF) signal having data encoded therein, analog antenna electronics configured to convert the RF signal to an analog electrical signal. The system also includes an analog-to-digital converter (ADC) directly coupled to the antenna and configured to generate a plurality of consecutive digital samples of the RF signal. The system further includes a quantizer. The quantizer includes a mode controller configured to develop a histogram associated with a set of the plurality of consecutive digital samples over a predetermined period of time and to generate at least one threshold based on a distribution of amplitudes of the set of the plurality of consecutive digital samples in the histogram. The quantizer also includes a comparator system that is configured to compare each of the plurality of consecutive digital samples with the at least one threshold to generate a comparison code associated with the comparison of each of the plurality of consecutive digital samples. The quantizer further includes conversion logic configured to convert the comparison code to a respective one of a plurality of output samples having a reduced number of bits relative to the respective digital sample to substantially mitigate potential interference and to facilitate extraction of the data.

DETAILED DESCRIPTION

Figure 1:
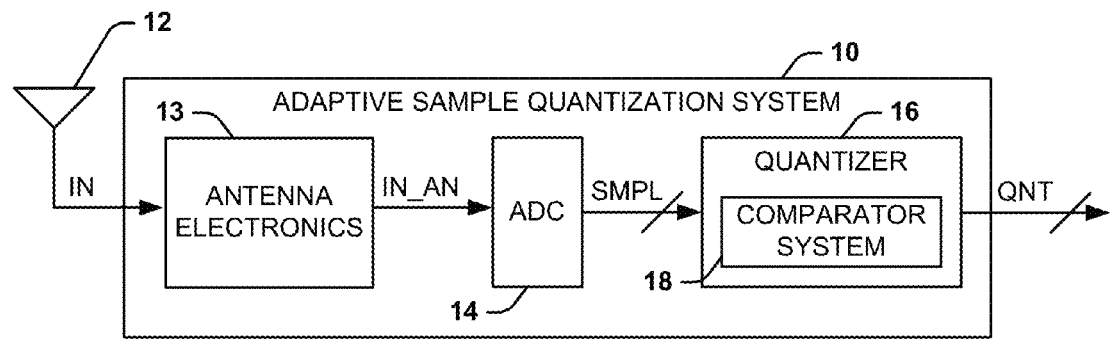
FIG. 1 illustrates an example of an adaptive sample quantization system in accordance with an aspect of the invention.

The present invention relates generally to radio frequency (RF) receiver systems, and specifically to systems and methods for adaptive sample quantization. An RF receiver, such as a GPS receiver, can include an adaptive sample quantization system. The adaptive sample quantization system includes an antenna configured to receive an RF signal which is provided to a high-resolution analog-to-digital (ADC). The high-resolution ADC is thus configured to generate a plurality of consecutive digital samples associated with the RF signal. The adaptive sample quantization system also includes a quantizer that is configured to convert the plurality of consecutive digital samples into a plurality of output samples corresponding to the plurality of consecutive digital samples. The output samples can each have at least one bit which numbers less than the plurality of bits associated with each of the consecutive digital samples.

The quantizer can include a mode controller configured to set at least one threshold based on a detected type of interference (i.e., mode). The at least one threshold can be set at a respective one or more magnitudes based on a histogram of data values of the consecutive digital samples. Therefore, the at least one threshold can be programmable at each set of digital samples that form the histogram. The consecutive digital samples can thus be compared with the at least one threshold to generate a comparison code. The comparison code can thus be provided to conversion logic configured to generate the output samples. The conversion logic can be configured to implement blanking control that nulls the value of a given one of the output samples in response to the respective digital sample having an amplitude outside of a range of amplitudes set by the at least one threshold. The conversion logic can also be configured to implement a mathematical algorithm to substantially remove interference associated with the digital samples. Thus, correlation of the output samples, including the null values, can be performed to substantially mitigate interference for demodulating the received RF signal.

The system described herein can be described as Smart Gain Control (SGC) that encompasses both analog and digital gain control and includes the benefits of each. For analog gain control, SGC can dynamically adjust a large range (e.g., approximately 72 dB) of available front-end analog gain for highest signal fidelity in the presence of jamming (e.g., to maintain linear operation with lowest noise figure). Unlike automatic gain control (AGC) in conventional GPS receivers that blindly respond to the jamming environment, the fast-response SGC commanded by advanced algorithms within an associated processor can provide additional anti-jamming capabilities, such as over current military navigation systems. In addition, the analog gain control of SGC operates in conjunction with the adaptive sample quantization system to preserve sample linearity.

On the digital side, the SGC engine can perform sample-by-sample anti-jam processing on 12-bit samples for effective digital dynamic range (e.g., approximately 60 dB). This extended dynamic range is used to implement advanced sample-level jamming mitigation techniques and can potentially yield approximately 10 dB processing gain against continuous wave (CW), swept CW, and narrowband jammers as well as approximately 3 to approximately 15 dB of processing gain against pulsed jammers. Under jamming conditions (i.e., including interference), a central quantization of the twelve bits can be performed which enables sample blanking. Under normal conditions, a non-central quantization scheme can be used, thus maximizing the signal correlation results. SGC can allow the quantizer to "ride on top" of interfering signals to extract GPS processing information. This engine can also enable sample-level pulse blanking, whereby blanking the correlators can mitigate the impact of jamming. The non-central quantizer output can then be re-quantized to output samples for correlation, thus reducing the processing impact on the correlators.

FIG. 1 illustrates an example of an adaptive sample quantization system 10 in accordance with an aspect of the invention. The adaptive sample quantization system 10 can be implemented in a variety of receiver systems, such as a GPS receiver, at a front end. As an example, the adaptive sample quantization system 10 can be implemented in each of separate sets for digital antenna electronics (DAE) for a GPS digital beam forming correlation system.

The adaptive sample quantization system 10 includes an antenna 12, antenna electronics 13, and an ADC 14. The antenna 12 is configured to receive an RF signal, such as a GPS signal, and to provide the RF signal to the antenna electronics 13. In the example of FIG. 1, the RF signal is demonstrated as a signal IN provided from the antenna 12 and is converted to an analog electrical signal IN_AN via the antenna electronics 13. The ADC 14 is coupled directly to the antenna electronics 13 and is configured to generate a plurality of high-resolution consecutive digital samples of the analog electrical signal IN_AN. As an example, the high-resolution digital samples can each have a quantity of bits that number greater at least ten (e.g., twelve) and can be generated at a high sample rate (e.g., tens of MHz). As a result, the adaptive sample quantization system 10 does not include an automatic gain control (AGC) system, but instead implements software-controlled analog gain control by sampling the analog RF signal in a high-fidelity manner, such that the digital samples have a relatively high dynamic range (e.g., approximately 72 dB). Accordingly, the digital samples generated by the ADC 14 can include interference that has been imposed on the received RF signal IN. In the example of FIG. 1, the digital samples generated by the ADC 14 are demonstrated as a signal SMPL.

The digital samples M-SMPL are provided to a quantizer 16. The quantizer 16 is configured to convert each of the digital samples SMPL into a corresponding one of a plurality of consecutive output samples, demonstrated in the example of FIG. 1 as a signal QNT. Each of the output samples QNT can have a quantity of bits that numbers less than the number of bits in each of the digital samples SMPL. As an example, each of the output samples QNT can include three bits, which could be a quantization of a subset of the bits in each of the digital samples SMPL, such as based on a type of interference in the RF signal IN. The quantizer 16 can generate the output samples QNT such that the interference in the digital samples is substantially mitigated. As a result, the output samples QNT can be provided to a correlation engine to ascertain the data that is modulated into the RF signal IN.

In the example of FIG. 1, the quantizer 16 includes a comparator system 18 that is configured to compare the digital samples SMPL to at least one threshold. The at least one threshold can be programmable based on a histogram of a set of the digital samples SMPL, such that the at least one threshold can change at each new set of the digital samples SMPL. Thus, the quantizer 16 can generate the output samples QNT based on the comparison of the digital samples SMPL with the at least one threshold. In addition, the conversion of the digital samples SMPL into the output samples QNT can be based on a mode of operation of the quantizer 16, as determined by the set of the digital samples SMPL in the histogram. The mode of operation can be based on a type of interference in the RF signal IN, such as continuous wave (CW) or pulsed (i.e., clipped) interference. The quantizer 16 can thus implement blanking control to null values of the output samples QNT that are outside a range of amplitudes set by the at least one threshold, such that the null values are subsequently correlated to zero. Accordingly, the interference on the RF signal IN can be substantially mitigated in decoding the output samples QNT.

Figure 2:
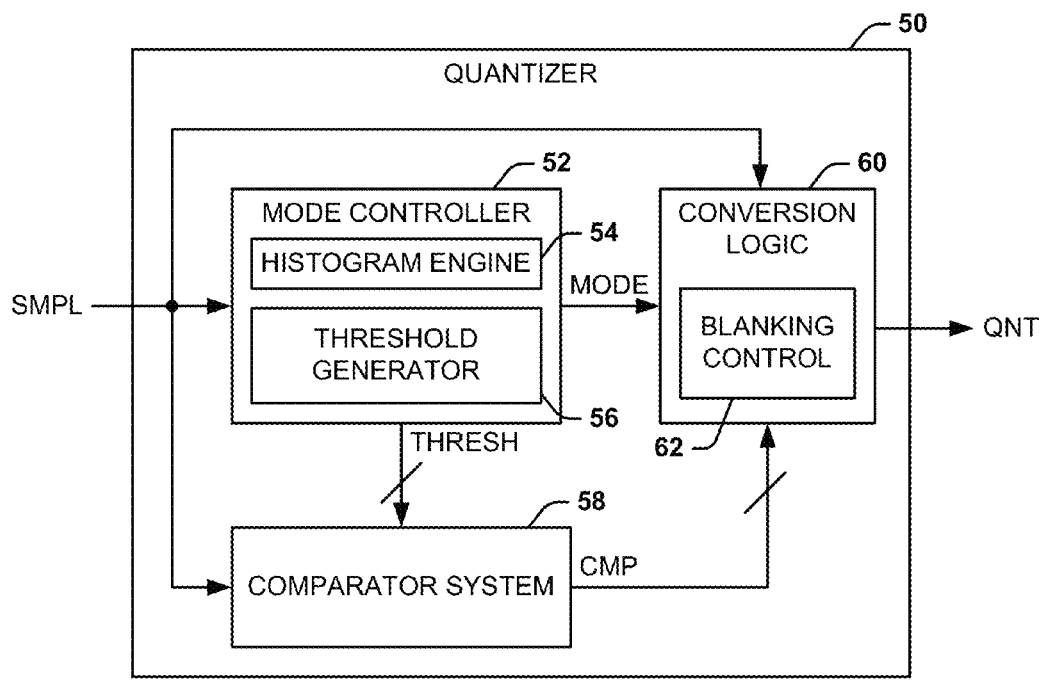
FIG. 2 illustrates an example of a quantizer in accordance with an aspect of the invention.

FIG. 2 illustrates an example of a quantizer 50 in accordance with an aspect of the invention. The quantizer 50 can correspond to the quantizer 16 in the example of FIG. 1. Therefore, reference is to be made to the example of FIG. 1 in the following description of the example of FIG. 2. Further-more, it is to be understood that the quantizer 50 can be implemented in hardware, software, or a combination of hardware and software.

The quantizer 50 includes a mode controller 52 configured to monitor the digital samples SMPL that are input to the quantizer 50 (e.g., from the ADC 14). The mode controller 52 includes a histogram engine 54 and a threshold generator 56. The histogram engine 54 is configured to generate a histogram of a set of the consecutive digital samples SMPL over a predetermined period of time. The set of the consecutive digital samples SMPL can thus indicate relative amplitudes of the digital samples SMPL to determine the presence of interference in the RF signal IN and to determine a mode corresponding to the type of interference (e.g., CW or pulse). The threshold generator 56 can thus calculate at least one threshold based on the determined mode. For example, the threshold generator 56 can calculate the at least one threshold based on the distribution of amplitudes in the histogram generated by the histogram engine 54. In addition, the histogram engine 54 can be configured to continuously generate subsequent histograms based on subsequent sets of the consecutive digital samples SMPL over given predetermined periods of time, such that the threshold generator 56 can continuously generate the thresholds based on the distributions of the amplitudes of the consecutive digital samples SMPL in the subsequent histograms. As one example, the sets of the consecutive digital samples in each histogram can be discrete, such that each of the consecutive digital samples SMPL is included in only a single histogram. As another example, the histograms can substantially overlap, such that the thresholds can continuously change, such as based on a statistical change in the distribution of the amplitudes of the consecutive digital samples SMPL in the overlapping histograms or in a single substantially continuously changing histogram.

The at least one threshold can be a digital threshold having a number of bits that is equal to the number of bits in each of the digital samples SMPL. As an example, upon a determination of the presence of CW interference in the RF signal IN based on the set of digital samples SMPL, the threshold engine 56 can be configured to calculate a first threshold at an approximate mean of an amplitude peak associated with the set of digital samples SMPL, and second and third thresholds at predetermined amplitudes (e.g., approximately three standard deviations or +/− a predetermined percentage) that are greater than and less than the first threshold, respectively. Therefore, the first, second, and third thresholds can provide an estimate of the thermal noise signal that is riding on the interference resident in the RF signal IN.

In the example of FIG. 2, the calculated thresholds are provided as a signal THRESH to a comparator system 58. The comparator system 58 can thus include one or more digital comparators that are each loaded with the respective one or more thresholds. As a result, each of the comparator(s) in the comparator system 58 can be configured to compare each digital sample SMPL with each of the respective threshold(s). As a result, the comparator system 58 can generate a comparison code CMP that corresponds to the comparisons of the digital samples SMPL with the threshold(s) THRESH, such that the comparison code can be indicative of the relative amplitude of each of the digital samples SMPL with respect to the thresholds THRESH.

The comparison code CMP and the digital samples SMPL are provided to conversion logic 60 that is configured to convert the digital samples SMPL to the corresponding output samples QNT based on the corresponding comparison code CMP associated with each of the digital samples SMPL. In the example of FIG. 2, the mode controller 52 can provide a signal MODE to the conversion logic 60 to indicate the type of interference to the conversion logic 60. As an example, the conversion of the comparison code CMP associated with the digital samples SMPL to the corresponding output samples QNT can be based on the mode indicated by the signal MODE. As another example, the output samples QNT can include the mode information provided by the signal MODE, such that the mode information can be provided to a downstream correlation engine. Regardless, because the threshold(s) are programmed based on the amplitude of the set of digital samples SMPL collected by the histogram engine 54, the conversion logic 60 can generate the output samples QNT in a manner that corresponds to the data (e.g., GPS data) that is modulated into the RF signal IN without the use of an AGC in the associated adaptive sample quantization system 10.

In the example of FIG. 2, the conversion logic 60 includes blanking control 62 that is configured to set null values for output samples QNT that correspond to digital samples SMPL having large amplitude variations caused by the interference present in the RF signal IN, such as based on the mode information provided by the signal MODE. For example, the at least one threshold THRESH can be calculated to define a range of values for a consecutive grouping of the digital samples SMPL having substantially stable amplitudes. Therefore, the blanking control 62 can set null values for the output samples QNT corresponding to the digital samples SMPL having amplitudes outside of the defined range of values set by the at least one threshold THRESH, and thus having large variations in amplitude resulting from the interference. Accordingly, the null value output samples QNT can appear invisible to downstream correlation engines, such that the blanking control 62 can substantially mitigate the interference resident on the RF signal IN for decoding the data therein.

Figure 3:
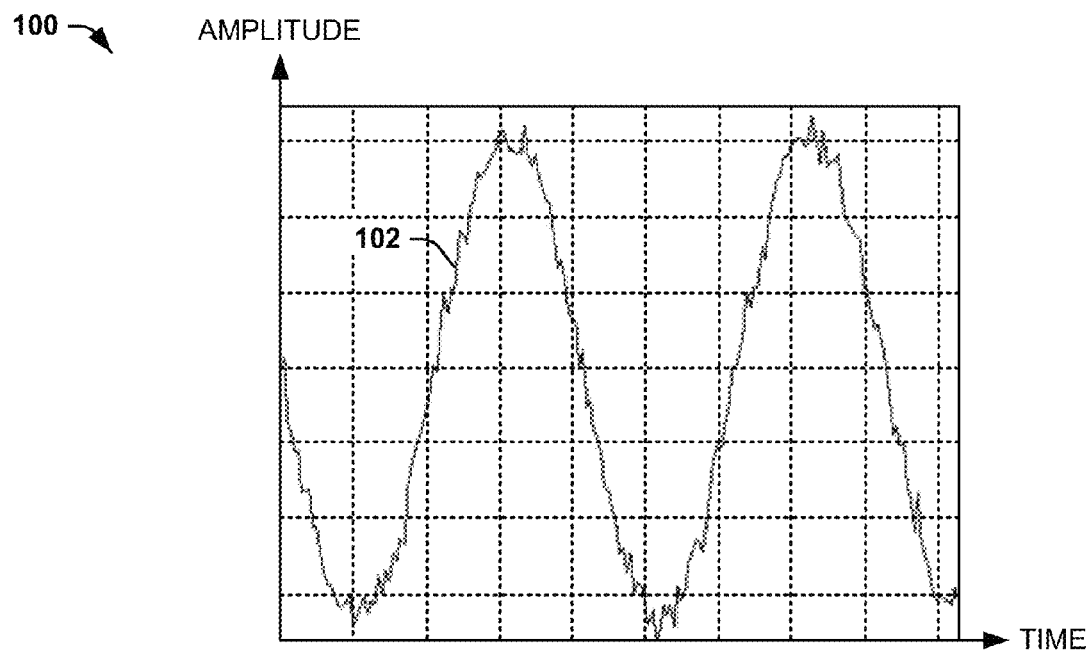
FIG. 3 illustrates an example of a timing diagram of a global positioning system (GPS) signal in accordance with an aspect of the invention.

FIG. 3 illustrates an example of a timing diagram 100 of a GPS signal 102 in accordance with an aspect of the invention. The GPS signal 102 in the timing diagram 100 can correspond to the RF signal IN that is received by the antenna 12 in the example of FIG. 1. The timing diagram 100 demonstrates that the GPS signal 102 is subjected to CW interference, such as from a jamming source, superimposed thereon. As a result, the GPS signal 102 has periodic large variations in amplitude based on the CW interference, demonstrated in the example of FIG. 3 as spanning approximately six of the depicted intervals. In addition, the GPS signal 102 has small variations in amplitude, demonstrated as less than one half of a depicted interval in amplitude, based on thermal noise. The GPS signal 102 can include GPS data that is encoded within the thermal noise.

Figure 4:
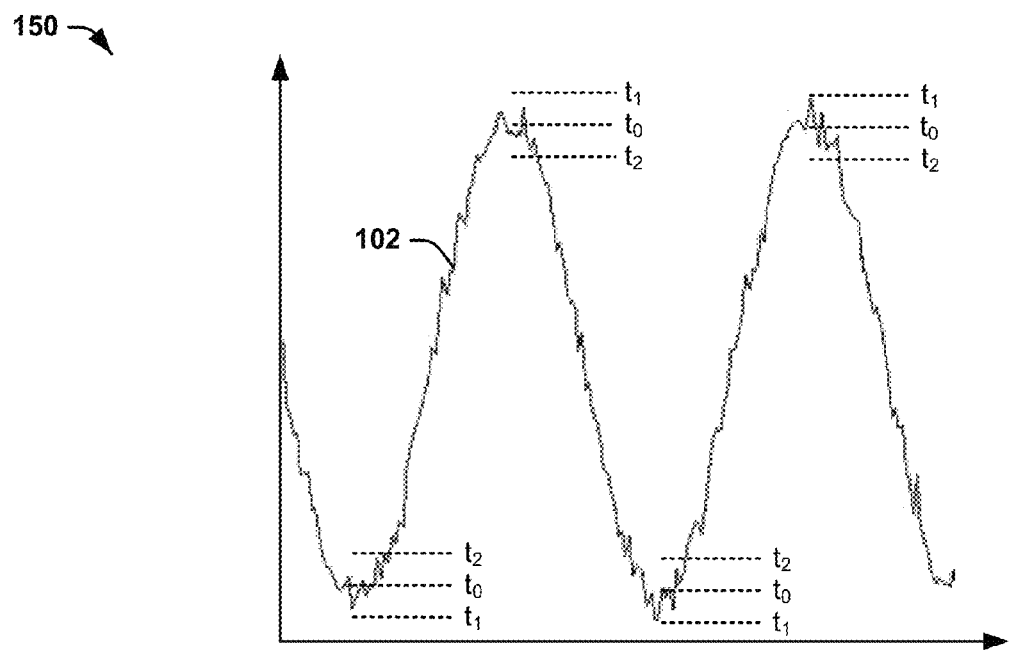
FIG. 4 illustrates an example diagram of a GPS signal in accordance with an aspect of the invention.

FIG. 4 illustrates an example diagram 150 of the GPS signal 102 in accordance with an aspect of the invention. The diagram 150 also includes a set of thresholds associated with each positive and negative peak of the GPS signal 102. For example, the histogram engine 54 can continuously collect sets of the digital samples SMPL corresponding to the GPS signal 102. The mode controller 52 can thus determine a type of interference resident on the GPS signal 102 (e.g., CW interference), and the threshold generator can calculate thresholds based on the collected sets of the digital samples, such as at each of different predetermined intervals.

In the example of FIG. 4, a threshold $t_0$ is calculated to have amplitudes that approximately correspond to each positive and negative peak associated with the GPS signal 102. As an example, the thresholds $t_0$ can correspond to the maximum positive and negative amplitude of the respective digital samples SMPL for each of the respective positive and negative peaks of the GPS signal 102. As another example, the thresholds $t_0$ can have amplitudes that correspond to a mathematical evaluation of a set of peak amplitude values of the digital samples SMPL for each of the respective positive and negative peaks of the GPS signal 102. In addition, a threshold $t_1$ is calculated to have a greater absolute value amplitude than each of the thresholds $t_0$ by a predetermined magnitude. For example, the thresholds $t_1$ can have absolute value amplitudes that are approximately three standard deviations (i.e., $3\sigma$) or a predetermined percentage greater than the absolute values of the thresholds $t_0$, such as based on a sampling rate of the ADC 12. Similarly, a threshold $t_2$ is calculated to have a lesser absolute value amplitude than each of the thresholds $t_0$ by a predetermined magnitude. The thresholds $t_2$ can have amplitudes that are both equal and opposite a difference between the thresholds $t_0$ and $t_1$, or can have amplitudes that are different from the difference between the thresholds $t_0$ and $t_1$. In the example of FIG. 4, the thresholds $t_0$, $t_1$, and $t_2$ can all have distinct amplitudes at each of the positive and negative peaks associated with the GPS signal 102, and can each be calculated as multi-bit (e.g., twelve bit) digital values.

Referring back to the example of FIG. 2, the comparator system 58 can be configured to compare the digital samples SMPL with each of the thresholds $t_0$, $t_1$, and $t_2$ to generate the comparison code. The comparison code CMP can thus provide an indication of the amplitude of a given one of the digital samples SMPL relative to the thresholds $t_0$, $t_1$, and $t_2$. Therefore, the comparison code CMP can indicate if a given one of the digital samples SMPL has an amplitude that is outside the range of amplitudes defined by the thresholds $t_0$, $t_1$, and $t_2$, such as greater than the threshold $t_1$ or less than the threshold $t_2$. Accordingly, the comparison code CMP can indicate such an amplitude, such that the blanking control 62 can set a null value for the corresponding output sample QNT. In addition, the comparison code CMP can also indicate amplitudes of the digital samples SMPL that are between the thresholds $t_0$ and $t_1$ (e.g., a "+1" value) or between the thresholds $t_0$ and $t_2$ (e.g., a "−1" value), which can thus correspond to the GPS data encoded in the thermal noise. As a result, the conversion logic can provide the "+1" and "−1" values in the output samples QNT, such that the output samples QNT can be can be correlated to decode the GPS data.

Figure 5:
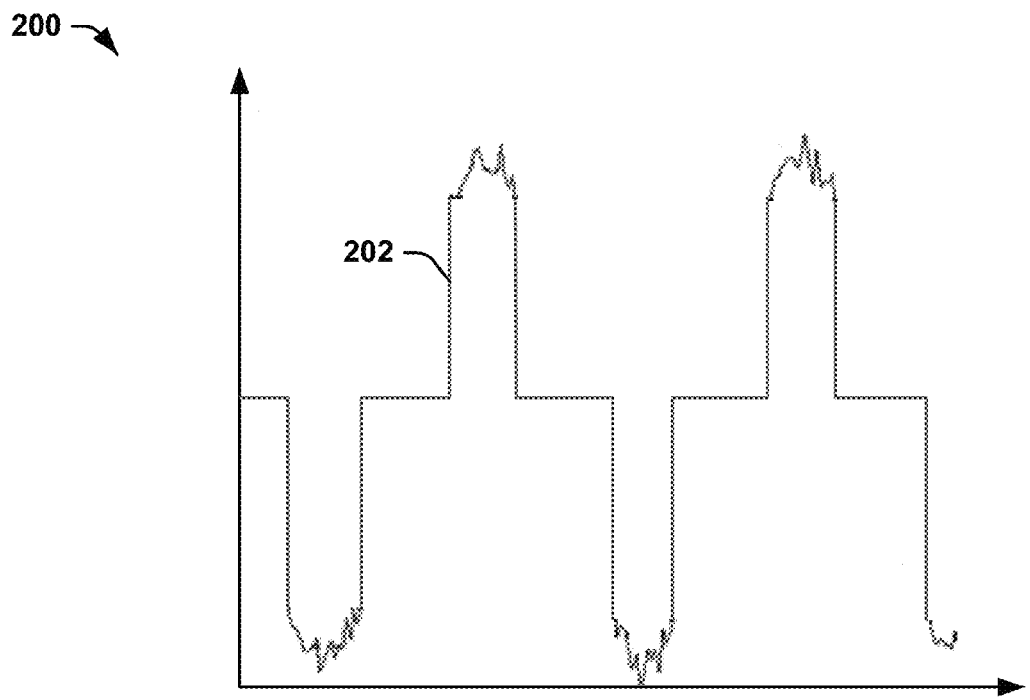
FIG. 5 illustrates an example diagram of a modified GPS signal in accordance with an aspect of the invention.

As another example, the conversion logic 60 can be configured to process the digital samples SMPL directly to generate the respective output samples QNT, such that the comparator system 58 is used only to implement the blanking control 62. Such an implementation is described with respect to FIG. 5. FIG. 5 illustrates an example diagram 250 of a modified GPS signal 252 in accordance with an aspect of the invention. The modified GPS signal 252 can correspond to the GPS signal 102 having been processed by the blanking control 62 in the example of FIG. 2. As an example, the at least one threshold can include only a single threshold (e.g., the threshold $t_2$, as demonstrated in the example of FIG. 4) that defines unacceptable absolute value amplitudes for the digital samples SMPL that are less than the absolute value amplitudes of the single threshold.

The comparator system 58 can thus compare the digital samples SMPL with the single threshold set by the threshold generator 56 to generate the comparison code CMP. Thus, the comparison code CMP can indicate whether a given output sample QNT corresponding to a respective digital sample SMPL should be set to a null value or not. In the example of FIG. 5, the modified GPS signal 252 is demonstrated as having null values where the absolute value amplitudes of the digital samples SMPL of the GPS signal 102 in the examples of FIGS. 3 and 4 were less than the range of amplitudes set by the thresholds $t_2$. The resulting modified GPS signal 252 thus includes null values and the amplitudes of the acceptable digital samples SMPL that include the interference.

Figure 6:
FIG. 6 illustrates an example diagram of another modified GPS signal in accordance with an aspect of the invention.

The conversion logic 60 can thus implement one or more mathematical algorithms on the modified GPS signal 252 to convert the modified GPS signal 252 to the output samples QNT. As an example, the conversion logic 60 can determine a mean of the absolute values of each of the digital samples SMPL of the modified GPS signal 252. The mean can then subsequently be removed by the conversion logic 60 to collapse the thermal noise distribution that is riding on top of the interference down to a zero magnitude mean, thus mitigating the interference. The resulting signal is demonstrated in the example of FIG. 6. FIG. 6 illustrates an example diagram 250 of another modified GPS signal 252 in accordance with an aspect of the invention. The modified GPS signal 252 can correspond to a signal having been processed by the conversion logic 60 to substantially mitigate the interference, such as described above. The modified GPS signal 252 can thus be output from the conversion logic 60 as the output samples QNT. Accordingly, the output samples QNT provided by the conversion logic 60 can be correlated to decode the GPS data.

Figure 7:
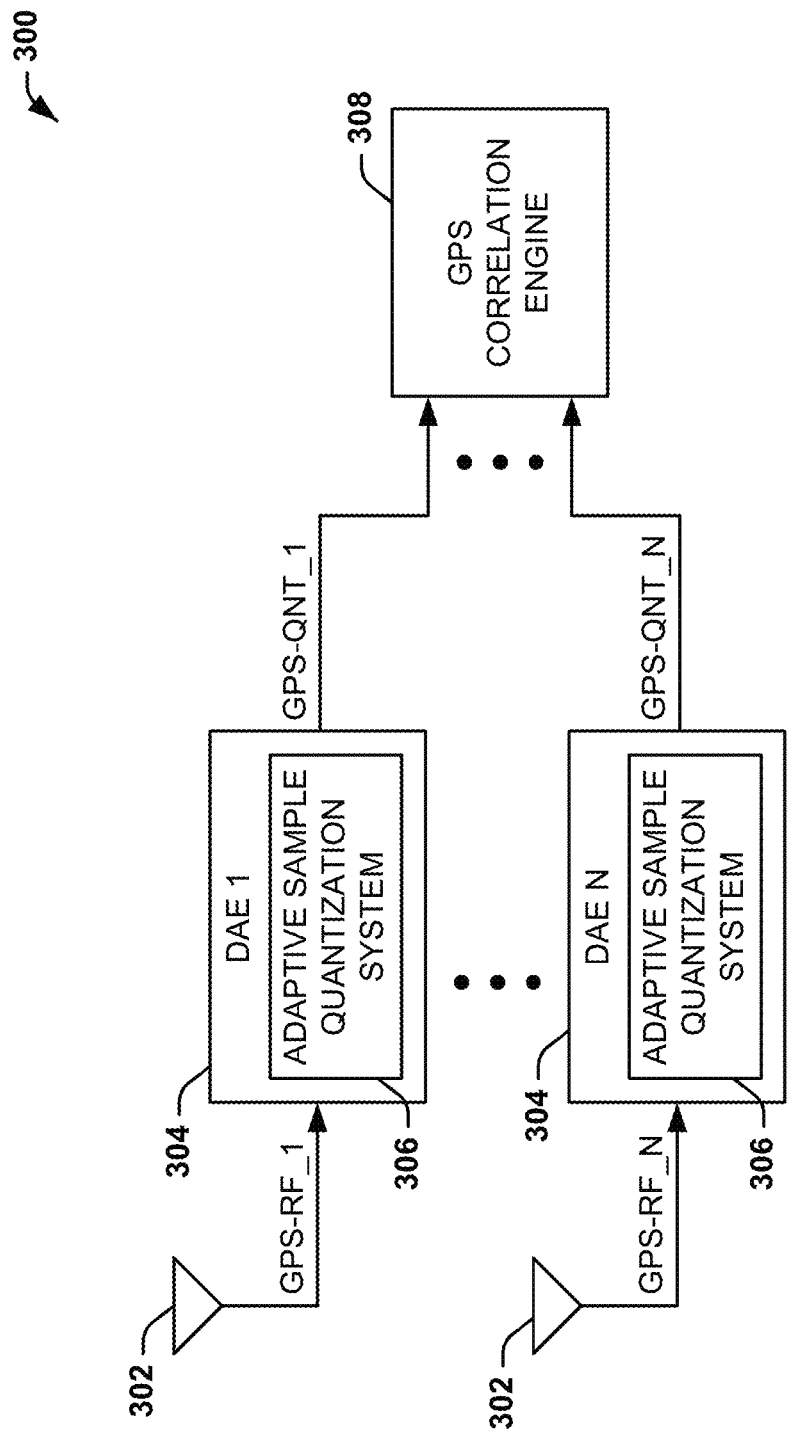
FIG. 7 illustrates an example of a GPS receiver system in accordance with an aspect of the invention.

FIG. 7 illustrates an example of a GPS receiver system 300 in accordance with an aspect of the invention. The GPS receiver system 300 can be implemented in a variety of navigation applications, such as aviation, nautical applications, and/or weapon guidance systems. The GPS receiver system 300 includes a plurality N of antennas 302 that are each coupled to a respective plurality N of digital antenna electronics (DAE) 304, where N is a positive integer. The antennas 302 are each configured to receive a GPS signal, demonstrated in the example of FIG. 7 as signals GPS-RF_1 through GPS-RF_N. It is to be understood that the GPS signals GPS-RF_1 through GPS-RF_N can each correspond to the same GPS signal GPS-RF that is spatially separated. Thus, the antennas 302 and respective DAE 304 can allow digital beam forming of GPS data encoded within the GPS signal GPS-RF.

Each of the DAE 304 can include an adaptive sample quantization system 306 that can be configured substantially similar to the adaptive sample quantization system 10 in the example of FIG. 1. Thus, the adaptive sample quantization system 306 can include antenna electronics and an ADC configured to sample the respective one of the signals GPS-RF_1 through GPS-RF_N at high resolution, such as 12 bits. As a result, the adaptive sample quantization system 306 does not include an AGC system, but instead implements software-controlled analog gain control by sampling the respective one of the analog electrical signals GPS-RF_1 through GPS-RF_N directly from associated antenna electronics in a high-fidelity manner, such that the digital samples have a relatively high dynamic range (e.g., approximately 72 dB). The adaptive sample quantization system 306 can also include a quantizer, such as the quantizer 50 in the example of FIG. 2, configured to quantize the digital samples generated by the ADC into respective output samples, demonstrated in the example of FIG. 7 as respective signals GPS-QNT_1 through GPS-QNT_N. The output samples GPS-QNT_1 through GPS-QNT_N can thus have a number of bits that is less than the number of bits of the digital samples of the GPS signals GPS-RF_1 through GPS-RF_N.

As an example, the quantizer of the adaptive sample quantization system 306 can be configured to generate a histogram of the digital samples of the GPS signal GPS-RF to determine a mode corresponding to interference resident on the GPS signal GPS-RF. The quantizer can thus calculate at least one threshold based on the mode and the set of digital samples in the histogram. As a result, the quantizer can compare the digital samples of the GPS signal GPS-RF with the at least one threshold to generate a comparison code. Accordingly, conversion logic in the quantizer can convert the digital samples of the GPS signal GPS-RF into the respective output samples GPS-QNT based on the conversion code. The output samples GPS-QNT can thus include null values corresponding to amplitudes of the digital samples of the GPS signal GPS-RF that are outside of an acceptable range of amplitudes defined by the at least one threshold.

The output samples GPS-QNT_1 through GPS-QNT_N provided from each of the respective DAE 304 are provided to a GPS correlation engine 308. The GPS correlation engine 308 can thus be configured to correlate the respective sets of the output samples GPS-QNT_1 through GPS-QNT_N. Thus, the GPS data that is encoded in each of the GPS signals GPS-RF_1 through GPS-RF_N can be correlated to ascertain GPS information.

Figure 8:
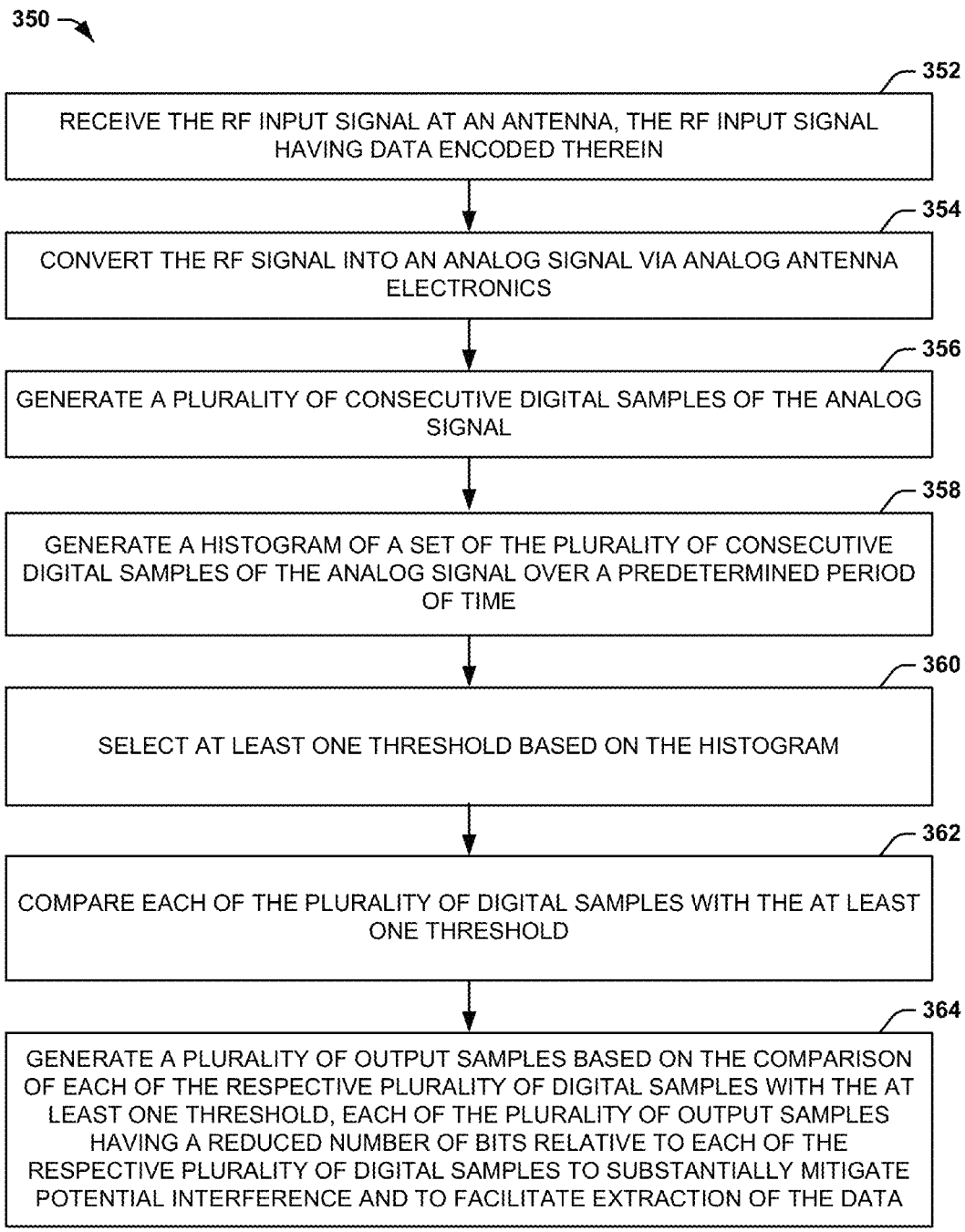
FIG. 8 illustrates an example of a method for quantizing an RF input signal in accordance with an aspect of the invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 8 illustrates an example of a method 350 for quantizing an RF input signal in accordance with an aspect of the invention. At 352, the RF input signal is received at an antenna, the RF input signal having data encoded therein. The RF input signal can correspond to a GPS signal. At 354, the RF signal is converted into an analog electrical signal via analog antenna electronics. At 356, a plurality of consecutive digital samples of the RF signal are generated. The consecutive digital samples can be high-fidelity samples, such as having ten or greater bits (e.g., twelve bits). At 358, a histogram of a set of the plurality of consecutive digital samples of the RF signal over a predetermined period of time is generated. The histogram can be one of a plurality of consecutive histograms or a continuously updating histogram based on continuous consecutive digital samples.

At 360, at least one threshold is selected based on the histogram. The at least one threshold can be selected based on a distribution of amplitudes associated with the set of the digital samples in the histogram. The at least one threshold can include a single threshold that defines amplitudes of the digital samples that are outside of a range of interest, and are thus to be set to a null value. The at least one threshold can also include a first threshold associated with a mean of peak amplitudes in the histogram, as well as second and third thresholds corresponding to a predetermined amplitude above and below the first threshold, respectively. At 362, each of the plurality of digital samples are compared with the at least one threshold. Each of the digital samples can be compared with each of the respective thresholds. At 364, a plurality of output samples are generated based on the comparison of each of the respective plurality of digital samples with the at least one threshold, each of the plurality of output samples having a reduced number of bits relative to each of the respective plurality of digital samples to substantially mitigate potential interference and to facilitate extraction of the data. The output samples can be generated based on conversion code that was generated in response to the comparisons.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An adaptive sample quantization system comprising:
an antenna configured to receive a radio frequency (RF) signal having data encoded therein;
analog antenna electronics configured to convert the RF signal to an analog electrical signal;
an analog-to-digital converter (ADC) directly coupled to the analog antenna electronics and configured to generate a plurality of consecutive digital samples of the analog electrical signal; and
a quantizer configured to determine a mode based on the plurality of consecutive digital samples and to select at least one threshold based on the determined mode, the quantizer being further configured to compare each digital sample with the at least one threshold to generate a corresponding one of a plurality of output samples having a reduced number of bits relative to the respective digital sample to substantially mitigate potential interference and to facilitate extraction of the data.

2. The system of claim 1, wherein the quantizer comprises a mode controller configured to determine the mode, the mode being associated with one of a type of interference and no interference associated with the RF signal, the mode controller being further configured to develop a histogram associated with a set of the plurality of consecutive digital samples over a predetermined period of time to determine the mode.

3. The system of claim 2, wherein the mode controller further comprises a threshold generator configured to generate the at least one threshold based on a distribution of amplitudes of the set of the plurality of consecutive digital samples in the histogram.

4. The system of claim 3, wherein the mode controller is configured to generate a plurality of histograms based on a plurality of sets of the plurality of consecutive digital samples over predetermined periods of time, and wherein the threshold generator is configured to generate at least one threshold associated with each of the plurality of histograms.

5. The system of claim 3, wherein the threshold generator is configured to generate a first threshold at an approximate mean of an amplitude peak associated with the set of the plurality of consecutive digital samples, to generate a second threshold at a predetermined amplitude greater than the first threshold, and a third threshold at the predetermine amplitude less than the first threshold.

6. The system of claim 1, wherein quantizer comprises a comparator system that is configured to compare each of the plurality of consecutive digital samples with the at least one threshold to generate a comparison code associated with the comparison of each of the plurality of consecutive digital samples,
wherein the quantizer is further configured to convert the comparison code to a respective one of the plurality of output samples.

7. The system of claim 6, wherein the quantizer is further configured to set a given one of the plurality of output samples to a null value in response to the respective one of the plurality of consecutive digital samples having a magnitude that is outside of a range of values defined by the at least one threshold.

8. The system of claim 1, wherein the quantizer is further configured to generate the plurality of output samples associated with the respective plurality of consecutive digital samples based on the comparison, and being further configured to implement blanking control to set a given one of the plurality of output samples to a null value in response to the respective one of the plurality of consecutive digital samples having a magnitude that is outside of a range of values defined by the at least one threshold.

9. The system of claim 8, wherein the quantizer is further configured to implement a mathematical algorithm on the set of the plurality of consecutive digital samples to collapse a thermal noise distribution associated with the set of the plurality of consecutive digital samples after implementing the blanking control to generate the plurality of output samples.

10. The system of claim 1, wherein the quantizer is configured to implement software-controlled analog gain control in sampling the plurality of consecutive digital samples to generate an extended dynamic range associated with the plurality of output samples.

11. A global positioning satellite (GPS) receiver system comprising at least one of the adaptive sample quantization system of claim 1, the GPS receiver system further comprising a GPS correlator configured to correlate the plurality of output samples to ascertain GPS data.

12. A method for quantizing a radio frequency (RF) input signal, the method comprising:
  receiving the RF input signal at an antenna, the RF input signal having data encoded therein;
  converting the RF signal into an analog electrical signal via analog antenna electronics;
  generating a plurality of consecutive digital samples of the analog electrical signal;
  generating a histogram of a set of the plurality of consecutive digital samples of the analog electrical signal over a predetermined period of time;
  selecting at least one threshold based on the histogram;
  comparing each of the plurality of digital samples with the at least one threshold; and
  generating a plurality of output samples based on the comparison of each of the respective plurality of digital samples with the at least one threshold, each of the plurality of output samples having a reduced number of bits relative to each of the respective plurality of digital samples to substantially mitigate potential interference and to facilitate extraction of the data.

13. The method of claim 12, further comprising determining a mode associated with the RF input signal based on the histogram, the mode being associated with one of a type of interference and no interference associated with the RF signal, wherein selecting the at least one threshold comprises selecting the at least one threshold based on the determined mode.

14. The method of claim 12, wherein comparing each of the plurality of digital samples with the at least one threshold comprises:
  comparing each of the plurality of consecutive digital samples with the at least one threshold to generate a comparison code associated with the comparison of each of the plurality of consecutive digital samples; and
  converting the comparison code to a respective one of the plurality of output samples.

15. The method of claim 12, wherein generating the plurality of output samples comprises setting a given one of the plurality of output samples to a null value in response to the respective one of the plurality of consecutive digital samples having a magnitude that is outside of a range of values defined by the at least one threshold, the method further comprising implementing a mathematical algorithm on the set of the plurality of consecutive digital samples to collapse a thermal noise distribution associated with respective non-null values of the plurality of consecutive digital samples to generate the plurality of output samples.

16. The method of claim 12, wherein selecting the at least one threshold comprises selecting at least one threshold based on a distribution of amplitudes of the set of the plurality of consecutive digital samples in the histogram.

17. The method of claim 12, wherein generating the histogram comprises generating a plurality of histograms based on a plurality of sets of the plurality of consecutive digital samples over predetermined periods of time, and wherein selecting the at least one threshold comprises selecting at least one threshold associated with each of the plurality of histograms.

18. An adaptive sample quantization system comprising:
  an antenna configured to receive a radio frequency (RF) signal having data encoded therein;
  analog antenna electronics configured to convert the RF signal to an analog electrical signal;
  an analog-to-digital converter (ADC) directly coupled to the antenna and configured to generate a plurality of consecutive digital samples of the RF signal; and
  a quantizer comprising:
    a mode controller configured to develop a histogram associated with a set of the plurality of consecutive digital samples over a predetermined period of time and to generate at least one threshold based on a distribution of amplitudes of the set of the plurality of consecutive digital samples in the histogram; and
    a comparator system that is configured to compare each of the plurality of consecutive digital samples with the at least one threshold to generate a comparison code associated with the comparison of each of the plurality of consecutive digital samples,
  wherein the quantizer is configured to convert the comparison code to a respective one of a plurality of output samples having a reduced number of bits relative to the respective digital sample to substantially mitigate potential interference and to facilitate extraction of the data.

19. The system of claim 18, wherein the quantizer is configured to implement blanking control to set a given one of the plurality of output samples to a null value in response to the respective one of the plurality of consecutive digital samples having a magnitude that is outside of a range of values defined by the at least one threshold, and to implement a mathematical algorithm on the set of the plurality of consecutive digital samples to collapse a thermal noise distribution associated with the set of the plurality of consecutive digital samples after implementing the blanking control to generate the plurality of output samples.

20. The system of claim 18, wherein the mode controller is configured to generate a plurality of histograms based on a plurality of sets of the plurality of consecutive digital samples over predetermined periods of time, and to generate at least one threshold associated with each of the plurality of histograms.

* * * * *